United States Patent [19]

Nagasako

[11] Patent Number: 5,345,194
[45] Date of Patent: Sep. 6, 1994

[54] FET HAVING TWO GATE BONDING PADS FOR USE IN HIGH FREQUENCY OSCILLATOR

[75] Inventor: Isamu Nagasako, Tokyo, Japan

[73] Assignee: NEC Corporation, Tokyo, Japan

[21] Appl. No.: 914,209

[22] Filed: Jul. 14, 1992

[30] Foreign Application Priority Data

Jul. 23, 1991 [JP] Japan .................. 3-181480

[51] Int. Cl.$^5$ .................. H03B 5/18; H04B 1/26
[52] U.S. Cl. .................. 331/99; 257/275;
257/365; 257/693; 257/703; 331/117 D;
331/117 FE; 455/318; 455/325
[58] Field of Search ............ 257/270, 365, 693, 695,
257/703, 275; 331/96, 99, 115, 117 D, 117 FE;
455/318, 319, 325, 326, 327, 333

[56] References Cited

U.S. PATENT DOCUMENTS

| | | | |
|---|---|---|---|
| 3,769,560 | 10/1973 | Miyake et al. .................. | 257/695 |
| 4,149,127 | 4/1979 | Murakami et al. .......... | 331/117 D X |
| 4,392,152 | 7/1983 | Hirano .................. | 257/695 X |
| 4,605,909 | 8/1986 | Tsironis .................. | 331/117 D X |
| 4,818,956 | 4/1989 | Stajcer .................. | 331/96 |
| 4,872,049 | 10/1989 | Derewonko et al. .......... | 357/68 |
| 4,982,247 | 1/1991 | Aoki et al. .................. | 257/275 X |

FOREIGN PATENT DOCUMENTS

| | | |
|---|---|---|
| 0166112 | 1/1986 | European Pat. Off. . |
| 2639373 | 4/1977 | Fed. Rep. of Germany . |
| 62-188275 | 8/1987 | Japan . |

OTHER PUBLICATIONS

"Ka-Band FET Oscillator", Ashok K. Talwar, IEEE Transactions on Microwave Theory and Techniques, pp. 731-734, Aug. 1985.

Shinikawa, et al., "SHF Converter Formed on a Single Teflon Fiberglass Substrate for Satellite TV Broadcasting", Institute of Television Engineers of Japan, Technical Report (RE83-40), pp. 7-11 (1983).

*Primary Examiner*—Siegfried H. Grimm

[57] ABSTRACT

A FET comprising two or more gate pads or terminals, and a reflection type oscillator including the above-mentioned FET. In this oscillator, a dielectric resonator is connected through a coupling line to the first gate pad of the FET and an output terminal is connected to the second pad. When the drain pad of the FET is connected to ground, and a suitable value of capacitive reactance is added to the source pad, then a negative resistance $-R$ appears on the first gate pad, and thus oscillation occurs at a resonance frequency fo of the dielectric resonator. If the load resistance value viewed from the second gate pad is set to R, the maximum oscillation output occurs. Accordingly this oscillator enables to set the oscillation conditions between the source and gate pads of the FET, and the output matching conditions between the second gate pad and the output terminal separately, and thus allows to set the oscillation conditions and the output matching conditions, respectively, simultaneously to the optimum values.

19 Claims, 6 Drawing Sheets

FET HAVING TWO GATE BONDING PADS FOR USE IN HIGH FREQUENCY OSCILLATOR

BACKGROUND OF THE INVENTION

1. Field of the Invention

The present invention relates to a field effect transistor (referred to as FET hereinafter) and more particularly to a FET suited to be made in integrated circuit form. Further it relates to a high frequency signal oscillator containing the FET as active element, and a frequency converter containing the oscillator.

2. Description of the Prior Art

The frequency converter of a high frequency (RF) receiver which receives electric waves of SHF band direct satellite broadcasting (DSB) from a geostationary satellite produces an intermediate frequency signal in response to a local oscillation signal from a local oscillator and the above-mentioned SHF band signal. The local oscillator is usually provided with a gallium arsenide field effect transistor (referred to as an GaAs FET, hereinafter) as active element, and the frequency of the local oscillation signal is stabilized by an dielectric resonator. The local oscillator and the frequency converter are desired, for the sake of scale-down or economy to be made in hybrid or monolithic integrated circuit form.

Many of this type conventional local oscillators used are reflection type oscillators. An example of them is described in the following literature: Shinkawa et al., "SHF Converter formed on A Single Teflon-Fiberglass Substrate for Satellite TV Broadcasting", Institute of Television Engineers of Japan, Technical Report (RE83-40) pp. 7–11, Oct. 27, 1983. Disclosed in that citation is a drain-grounded oscillator including as an active element, a GaAs FET the drain terminal of which is grounded for high frequency. The gate terminal is connected through a coupling line to a dielectric resonator, and the source terminal is connected to a capacitive reactance and a load. The capacitive reactance with a suitable value produces a negative resistance at the gate terminal. When the line impedance of the coupling line and the distance between the gate terminal and the dielectric resonator, respectively, are properly set, a high frequency signal is produced and outputs from the source terminal.

The following requirements are imposed to the reflection type oscillator: to create a great negative resistance at the source terminal of the GaAs FET and to be placed in impedance-matching with the load. It is very difficult to fulfill the above-mentioned two conditions by only the adjustment of the capacitive reactance connected to the source terminal. In other words, if, because of great variation of the negative resistance appearing at the gate terminal with the capacitive reactance added to the source terminal, the value of the capacitive reactance is set to meet the oscillation conditions at the gate terminal, it would be impossible to match with the load so as to obtain the maximum oscillation signal output at the source terminal.

SUMMARY OF THE INVENTION

It is an object of the present invention to provide a high frequency signal oscillator capable of meeting readily and simultaneously the optimal oscillation and output conditions.

Another object of the present invention is to provide a high frequency signal generator and a frequency converter suited to be readily fabricated in hybrid and monolithic integrated circuit form.

A further object of the present invention is to provide a field effect transistor of a structure suited for active elements for generation of signals.

BRIEF DESCRIPTION OF THE DRAWINGS

The above-mentioned and other objects, features and advantages of this invention will become more apparent by reference to the following detailed description when taken in conjunction with the accompanying drawings, wherein:

FIG. 4(b) is a cross-sectional view taken along line A3—A4 of FIG. 4(a) with the top cover put on;

SUMMARY OF THE INVENTION

FETs according to the present invention comprise a source bonding pad (source pad) connected to a source, a drain bonding pad (drain pad) connected to a drain and a plurality of gate bonding pads (gate pads) connected to a gate. One of them is provided with a gate pad at each end of a gate. Another is provided with two gate pads at one end of the gate. Such a FET may be mounted in a package with the source, drain, and gate pads connected to the source, drain, and gate terminal, respectively, outgoing from the package.

The above-mentioned FETs are provided with at least two gate pads or terminals, and hence are adequate for application to a circuit in which two or more circuit elements are connected to a gate, for example, enabling to easily raise the performance of the band reflection oscillator of drain-grounded type having a construction of connecting both, the dielectric resonator and the load to the gate. In detail, the dielectric resonator is connected to one of gate pads or terminals of the FET, and the load to the other. Thus in this reflection type oscillator, the negative resistance produced on the gate pad can be set to the optimum value by adjusting the capacitive reactance added to the source pad or terminal. It is possible also to produce the optimum load matching by the arrangement of impedance matching elements between the other of the gate pads and the load independently of the adjustment of the above negative resistance value.

A plurality of gate pads or terminals of the above-mentioned FET are arranged considerably free, and hence in a high frequency (RF) circuit using the FET, for example, the above reflection type oscillators, it is possible to arrange circuit elements so as to minimize degradation of performance due to parasitic elements and the like, leading to improvement in circuit performance. Besides it makes it easier for these RF circuits to be made in a hybrid or monolithic integrated circuit form.

DETAILED DESCRIPTION OF THE PREFERRED EMBODIMENTS

Figure 1A:
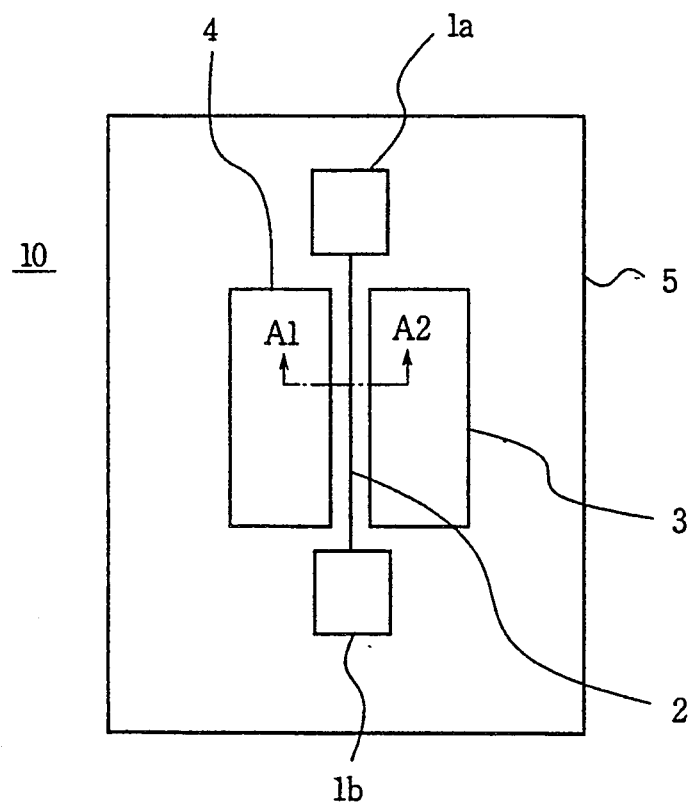
FIG. 1(a) is a plan view of a FET chip of the first embodiment and FIG. 1(b) is a cross-sectional view taken along line A1—A2 of FIG. 1(a), to an enlarged scale.
Figure 1B:
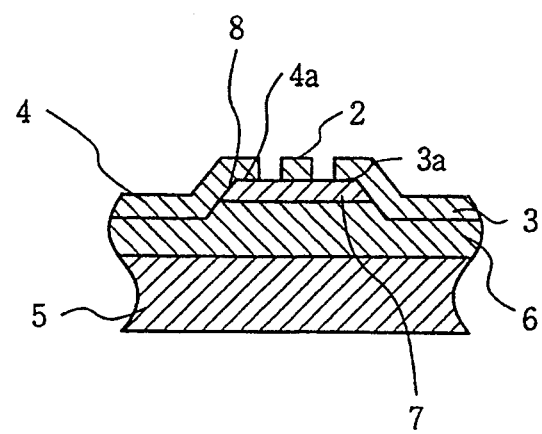

Referring to FIGS. 1(a) and 1(b), the structure of, and process of fabricating, a field effect transistor chip (referred to as FET chip hereinafter) 10 will be described below. Over a chrome (Cr)-doped semi-insulating semiconductor substrate 5 of GaAs are grown a undoped buffer layer 6 on which a sulfur (S)-doped n-channel layer 7 doped with S at 1 to $2 \times 10^{17}$ cm$^{-3}$ is grown. Then in order to reduce stray capacity of the FET 10, the channel layer 7 is selectively etched to leave only the mesa 8 as an active part of the FET chip 10 and to expose the buffer layer 6 in which no mesa 8 is formed. Subsequently ohmic electrodes are built by placing a gold-germanium/nickel (AuGe/Ni) alloy on the surface of channel layer 7 by the lift-off technique, and used as drain 3a and source 4a. From the drain 3a and source 4a, the AuGe/Ni alloy extends on, and outwards with respect to, the outside of mesa 8 thus to form drain pad 3 and source pad 4. Then the Schottky barrier metal of aluminum (Al) is deposited on the surface of channel layer 7 between drain 3a and source 4a to form a gate (electrode) 2. At both ends of the gate 2, the gate pads 1a and 1b are deposited on the surface of buffer layer 6. Now it should be noted that gate pads 1a and 1b are located on the opposite sides of gate 2. The arrangement of gate pads 1a and 1b has the effect of allowing more free design of the circuit using the FET chip 10.

To increase the current capacity on the FET chips, the corresponding drains and sources are arranged in a skewed relation to a row of gates. Electrode groups of different types are biased via respective pads. A plurality of FET chips 10 together with other RF circuit elements can be built over a semi-insulating semiconductor substrate 5 (and buffer layer 6) to fabricate a monolithic integrated circuit.

Figure 2:
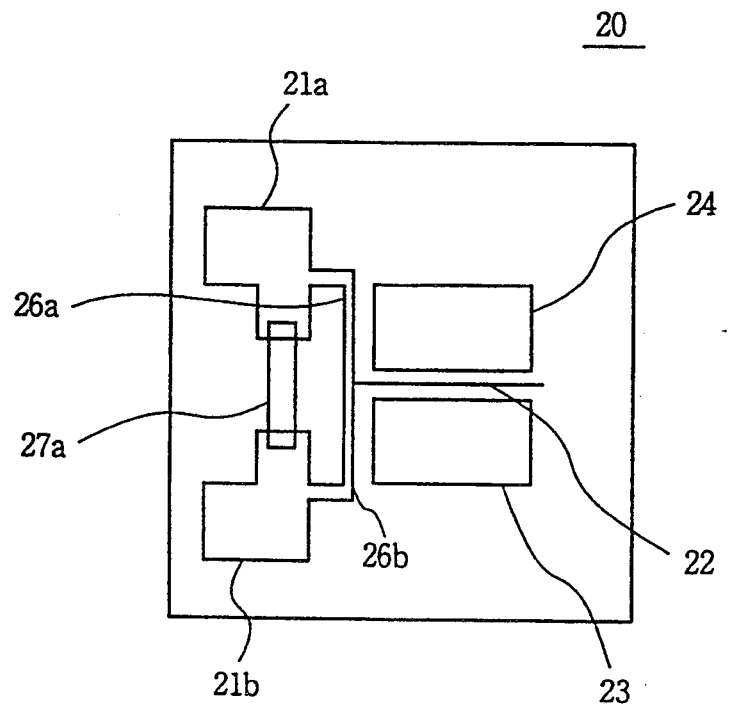
FIG. 2 is a plan view of a second embodiment of the present invention.

Referring to FIG. 2, a gate 22, a drain pad 23, and a source pad 24 formed over a FET chip 20 correspond to gate 2, drain pad 3, and source pad 4 formed over FET chip 10 in FIGS. 1a and 1b. Gate 22 is connected through branch lines 26a, 26b to gate pads 21a, 21b between which an absorbing resistor 27a is interconnected. Absorbing resistor 27a is a metal film formed by vacuum sputtering or a semiconductor resistor formed by ion implantation.

Branch circuits 26a, 26b and absorbing resistor 27a forms a Y branch circuit for simultaneously making three impedance matching circuits: two circuits connected to the ends of gate pads 21a, 21b, respectively, and gate 22. In other words setting the lengths of branch circuits 26a, 26b to about ¼ the length λ of operation frequency of FET chip 20, and the resistance of absorbing resistor 27a to about twice the impedance of the two connection circuits, then the three circuits are altogether impedance-matched, and thus signal isolation can be established between gate pads 21a, 21b. As described above, FET 20 has a structure for raising signal isolation between gate pads 21a, 21b.

Figure 3:
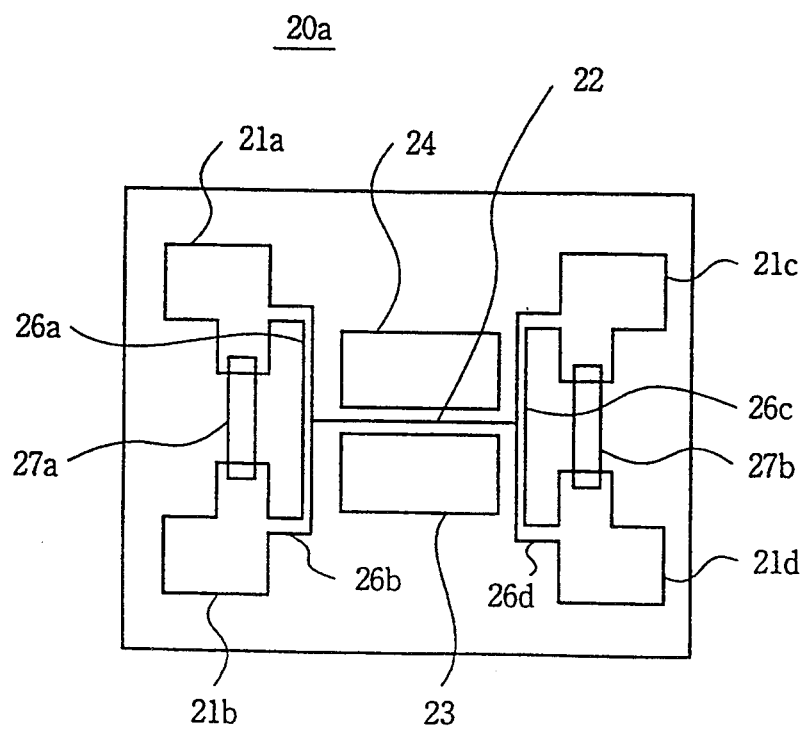
FIG. 3 is a plan view of a third embodiment of the present invention.

Referring to FIG. 3, FET on chip 20a gate pad parts are arranged on the opposite sides, and connected to the opposite ends, respectively, of the gate 22. Each pad part is constructed in the same manner as the gate pad part of FET chip 20 shown in FIG. 2. Not only in the left-hand pad part but also in the right-hand pad part therefore signal isolation can be established between circuits connected to gate pads 21c, 21d, respectively, by setting branch lines 26c, 26d and absorbing resistor 27b to adequate values, respectively, and thus allows more circuits to be connected to gate 22 without significant signal interference between them.

Figure 4A:
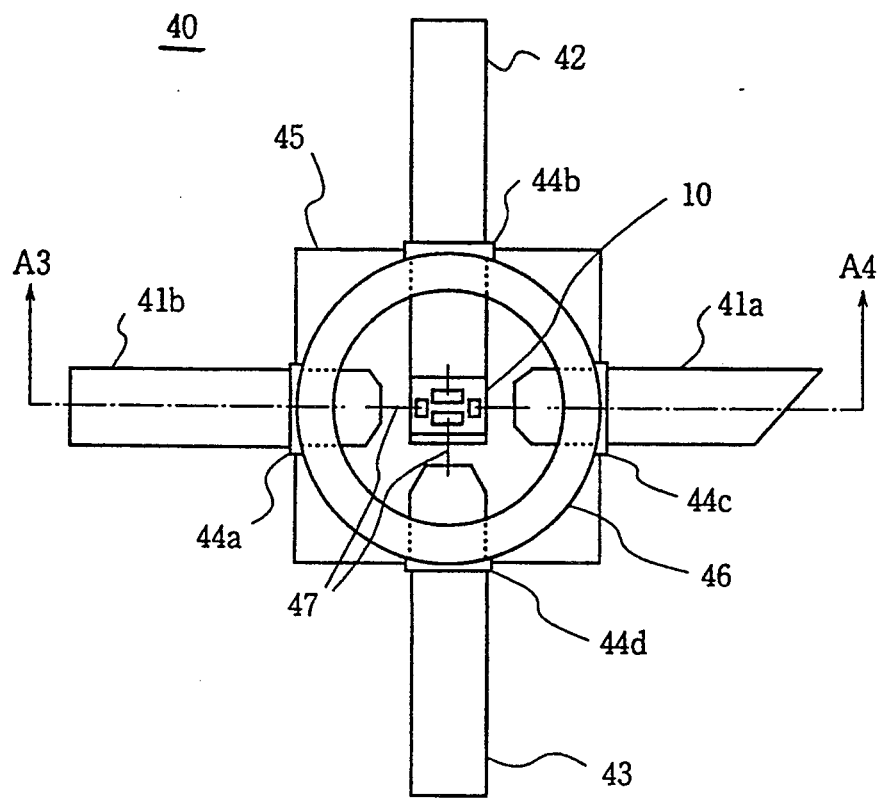
FIG. 4(a) is a plan view of a FET, with a top cover removed, of a fourth embodiment of the invention
Figure 4B:
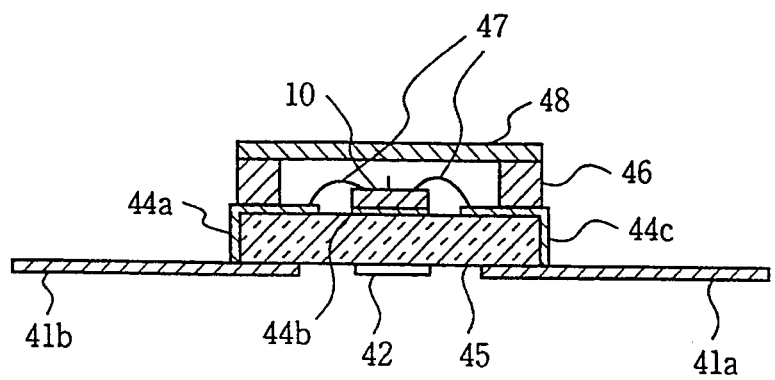

Referring to FIGS. 4(a) and 4(b) together with FIGS. 1(a) and 1(b), a FET chip structure 40 will be now described. FET chip 10 mounted in a package consisting of a square plate 45 of alumina ceramic, a ring constituting a surrounding wall 46, and a cover 48. There is provided on each side of alumina substrate 45, a strip-formed terminal (gate terminals 41a, 41b, source and drain terminals 42, 43) which extends perpendicularly to, and beyond, the edge and towards the center of alumina plate 45. An angled conductor film (44a, 44b, 44c, 44d) is fitted on each edge of plate 45. The horizontal part of it extends on the plate surface toward FET chip 10 (conductor film 44b only extends to the center of the plate surface) and the vertical part reaches the corresponding terminal. With a solder (not shown), alumina plate 45 is adhered to ring 46, and cover 48 is connected to ring 46, thereby FET chip 10 being airtight sealed.

FET chip 10 is sealed at the center of alumina plate 45 and adhered to conductor film 44b with a solder (not shown) containing Au—Sn. With bonding wire 47, gate pads 1a, 1b are connected to conductor films 44c, 44a, respectively, and in turn to gate terminals 41a, 41b, respectively. The source and drain pads 4, 3 are connected to conductor films 44b, 44d, respectively, and in turn to source and drain terminals 42, 43. It is to be noted that gate terminals 41a, 41b pass outwardly of the opposite sides of alumina plate 45. Such extension of gate terminals 41a, 41b at different sides enables more free design of the circuit in which the FET structure 40 is used, as described later with reference to FIGS. 5 and 6.

Figure 5:
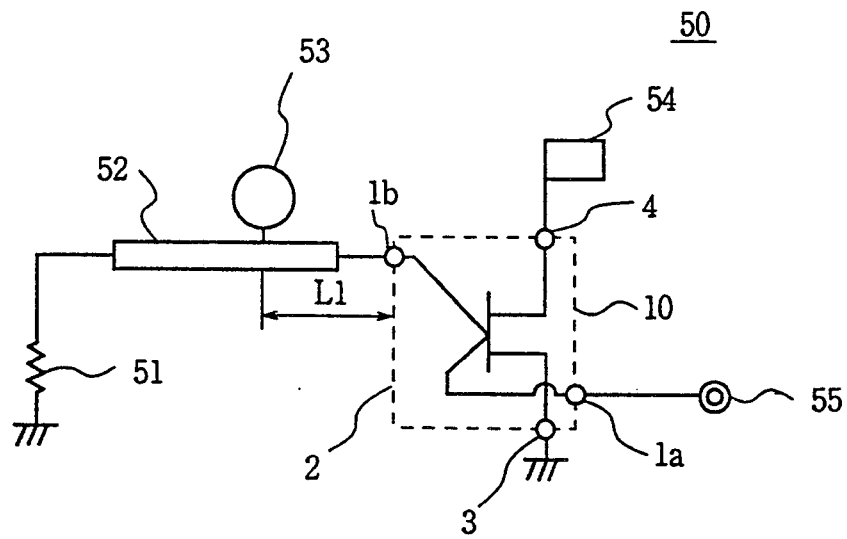
FIG. 5 is an equivalent circuit diagram of the fifth embodiment of the present invention.

Referring to FIG. 5 which shows a diagram of the equivalent circuit, a high frequency signal oscillator 50 which is a reflection type oscillator including, as an active element, a FET chip 10 shown in FIG. 1 will be described below. The drain pad 3 of FET chip 10 is grounded, and a capacitive reactance 54 is connected to source pad 4 to produce negative resistance −R at gate pads 1a, 1b. Gate pad 1b of FET 10 is connected to one end of a coupling line 52 and through the latter to a dielectric resonator 53. The other end of the coupling line 52 is connected to a terminal resistor 51. Gate pad 1a of FET 10 is connected to an output terminal 55 to which a load (not shown) is connected.

Capacitive reactance 54 is set to increase the negative resistance −R appearing at gate terminal 1b at resonance frequency fo of dielectric resonator 53. When the distance between gate 2 of FET chip 10 and gate pad 1b is short, distance L1 between gate pad 1b and dielectric resonator 53 is set to about ½ of wavelength λ at resonance frequency fo of dielectric resonator 53. Then by the action of dielectric resonator 53, only signals having resonance frequency fo out of RF signals from gate terminal are reflected from gate terminal 1b, and thus oscillator 50 oscillates at resonance frequency fo. Signals of the frequencies other than the resonance frequency fo are terminated by terminal resistor 51, and hence do not appear at output terminal 55 of oscillator 50.

If negative resistances of gate terminals 1a, 1b are −R, the resistance (resistance value of the load) viewed from output terminal 55 from gate terminal 1a is up to R. In the case where the load resistance value is R, maximum oscillation signal output can be obtained from output terminal 55. In brief, in this oscillator 50, after establishing the oscillation conditions involving source pad 4 and gate pad 1b, load matching can be produced between gate pad 1a and output terminal 55 independently of the oscillation conditions. As described above it has become possible to simultaneously meet the oscillation condition and the load matching condition by virtue of providing both gate pads 1a, 1b on FET chip 10.

Figure 6:
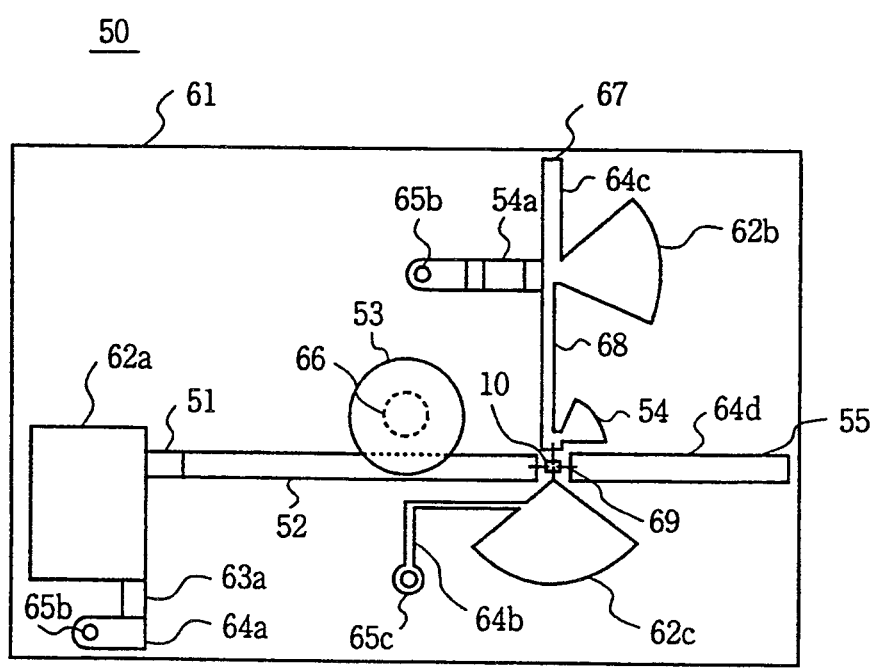
FIG. 6 is a plan view of the embodiment of FIG. 5 fabricated on an alumina plate.

Referring to FIG. 6 together with FIG. 5, the high frequency signal oscillator 50, which is a hybrid integrated circuit 50 built on an alumina plate 61, will be described below. Coupling line 52, dielectric resonator 53, capacitive reactance 54, and output terminal 55 are formed as a distributed constant circuit. Terminal resistor 51 is also formed as a concentrated constant circuit. For making dielectric resonator 53, a ceramic having a composition of $(ZrSn)TiO_4$ (relative dielectric constant $\epsilon_r = 39$) or the like is used.

Further description of components of the high-frequency signal generator 50 except those shown in FIG. 5 will be given below. A grounded circuit for the terminal resistor 51 consists of a short stub 62a of which one end is connected to terminal resistor 51 and the other end is opened. There is provided an auto bias circuit for gate pad 1b, which consists of a resistor 63a of which one end is connected to stub 62a, and a grounded through hole 65a to which the other end of resistor 63a is connected through connection line 64a. Dielectric resonator 53 is held through the intermediation of a support 66 made from a low dielectric constant material of alumina plate 61, thus Q of resonator 53 being kept high. Drain pad 3 is connected to ground through a grounding circuit which is a short stub 62c, of which one end is connected to drain pad 3 and the other end is opened. Gate pad 1a is connected through connection line 64d to output terminal 55. Source pad 4 is connected to a capacitive reactance 54 and in addition to a low band filter consisting of a λ/4 line 68, a short stub 62b, and a chip condenser 54a. Source bias is provided from power supply through a source bias terminal 67, connection line 64c and the filter. Resistor 63a and chip condenser 54a form a concentrated constant circuit.

Referring to FIGS. 5 and 6 illustrating high frequency signal oscillator 50, gate pads 1a, 1b are oppositely located in FET chip 10, and accordingly coupling line 52 and connection line 64d are allowed to extend on the opposite sides. This enables separate location of components (dielectric resonator 53 and output terminal 55) of which the circuit constants are needed to be determined almost independently, therefore allowing more free circuit design and facilitating their fabrication as hybrid integrated circuit.

In this embodiment, as described above with reference to FIG. 6, the high frequency signal generator 50 is constructed as a hybrid integrated circuit and, it is, of course, possible to build a monolithic integrated circuit on a GaAs substrate with the dielectric resonator 53 placed outside of the substrate.

Figure 7:
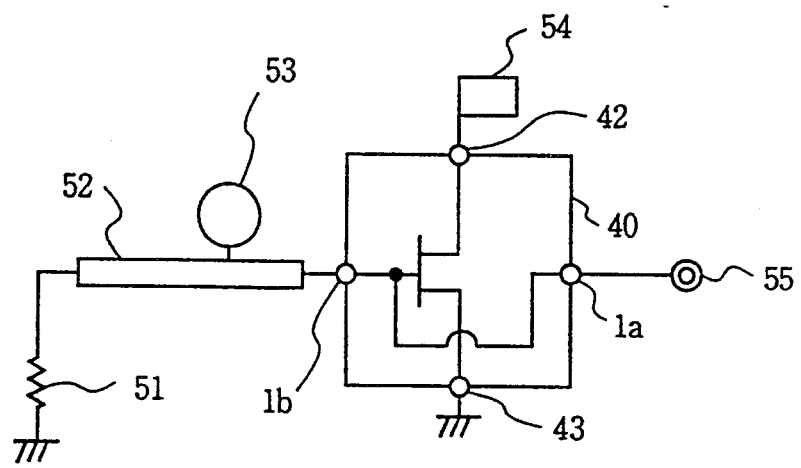
FIG. 7 is an equivalent circuit diagram of the sixth embodiment of the present invention.

FIG. 7 shows alternative embodiment of the high frequency signal oscillator, designated generally with a reference character 60, which comprises a FET chip 40 described with reference to FIGS. 4(a) and 4(b) instead of FET 10 in FIG. 5. Thus the FET 40 is connected at gate terminal 1a to output terminal 55, at gate terminal 1b to coupling line 52, at source terminal 42 to capacitive reactance 54, and at drain terminal 43 to ground. Oscillator 60 has about the same other circuit components, in operation, and is suited for hybrid integrated circuit as high frequency signal generator 50.

Figure 8:
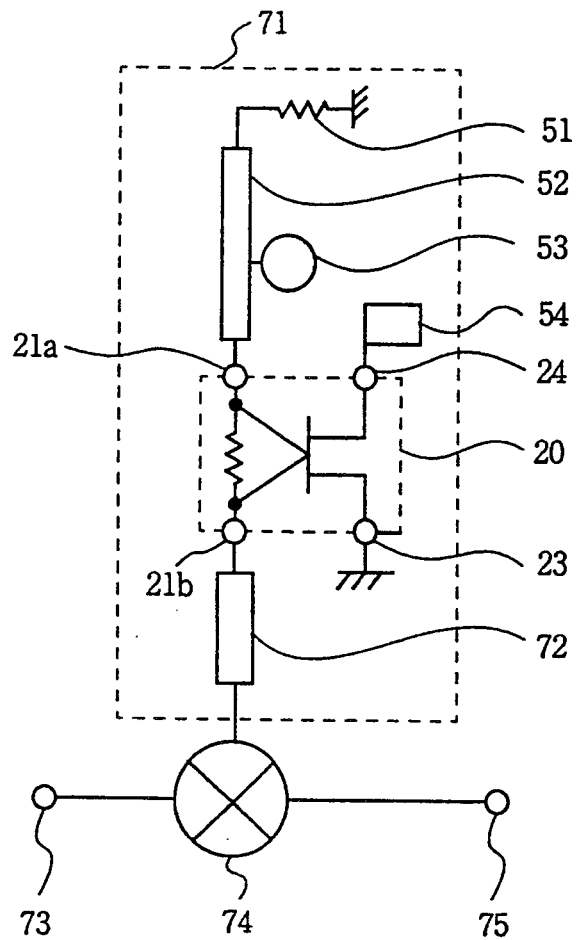
FIG. 8 is an equivalent circuit diagram of the seventh embodiment of the present invention.

Referring to FIG. 8, a frequency converter 70 will be described below. It produces an intermediate frequency (IF) signal at IF output terminal 75 in response to a RF signal from RF input terminal 73 and a local oscillation signal from a high frequency signal oscillator 71.

In the high frequency signal oscillator 71, FET chip 20 described with reference to FIG. 2 is used instead of FET chip 10 of high frequency signal oscillator 50 shown in FIG. 5. Accordingly, the coupling line 52 is connected to gate pad 21a of FET 20, capacitive reactance 54 to source pad 24, and drain pad 23 is connected to ground. An impedance transformer 72 is interconnected between gate pad 21b and a mixer 74 for matching the impedances of both, and thus a local oscillation signal is supplied to a mixer 74. In the oscillator 71, signal isolation is produced between gate pads 21a, 21b, and thereby prevents the operation of high frequency signal oscillator 71 from becoming unstable due to various spurious signals produced from mixer 74. Also, this frequency converter can be made in hybrid or monolithic integrated circuit form.

In frequency converter 70, changing mixer 74 into a balanced type mixer results in needing the supply of two local oscillation signals to the balanced type mixer, and hence it is desired to use FET chip 20a instead of FET chip 20. In this case, both gate pads 21b, 21d of FET 20a are connected to coupling line 52, gate pad 21a to one of local oscillation signal input terminals of the balanced type mixer, and gate pad 21c to the other.

As described above, the high frequency signal oscillators according to the present invention comprise a FET chip provided with two or more gate pads or terminals and, mounted not in a package. This enables the connection of both dielectric resonator and output terminal to the gate electrode of the FET, and facilitates setting of the optimum oscillation conditions and optimal output conditions independently. It is also possible to freely arrange or locate gate pads or terminals of the FET. This not only contributes to improving the performance of the oscillator but also to easier fabrication of these oscillators or frequency converters including these oscillators in hybrid and monolithic integrated circuit form.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A field effect transistor comprising a source, a source bonding pad connected to said source, a drain, a drain bonding pad connected to said drain, a gate, a plurality of gate bonding pads connected to said gate, one end of said gate being connected to two gate bonding pads, and a resistor interconnected between said two gate bonding pads.

2. A field effect transistor according to claim 1 wherein two gate bonding pads are arranged on opposite sides of said gate.

3. A field effect transistor according to claim 1 wherein said field effect transistor is built in a gallium arsenide substrate.

4. A field effect transistor according to claim 2 mounted in a ceramic package, the source bonding pad thereof being connected to a source terminal outgoing from said ceramic package, the drain bonding pad thereof being connected to a drain terminal outgoing from said ceramic package, and the two gate bonding pads arranged on opposite sides of said gate each being connected to two gate terminals, respectively, and outgoing from said ceramic package.

5. A field effect transistor according to claim 4 wherein said two gate bonding pads arranged on opposite sides of said gate each are connected to the ends, respectively, of said gate, and said gate terminals each outgoing on the opposite sides, respectively, of said ceramic package.

6. A high frequency signal oscillator comprising:
a field effect transistor including a source, a source bonding pad connected to said source, a drain, a drain bonding pad connected to said drain, a gate, and two gate bonding pads each connected to the ends, respectively, of said gate;
bias means for supplying bias voltages, respectively, to each electrode of said field effect transistor from power supply;
a dielectric resonator connected through a coupling line to one of said gate bonding pads;
an output terminal of high frequency signal connected to the other of said gate bonding pads;
a capacitive reactance connected to said source bonding pad; and
grounding means for said high frequency signal for grounding said drain bonding pad.

7. A high frequency signal oscillator according to claim 6 made in hybrid integrated circuit form.

8. A high frequency signal oscillator according to claim 6 made on a gallium arsenide substrate excluding said dielectric resonator.

9. A high frequency signal oscillator comprising:
a field effect transistor including a source, a source bonding pad connected to said source, a drain, a drain bonding pad connected to said drain, a gate, and two gate bonding pads connected to one end of said gate, and a resistor interconnecting between said two gate bonding pads;
bias means for supplying bias voltages, respectively, to each electrode of said field effect transistor from power supply;
a dielectric resonator connected through a coupling line to one of said gate bonding pads;
an output terminal of high frequency signal connected to the other of said gate bonding pads;
a capacitive reactance connected to said source bonding pad; and
grounding means for said high frequency signal for grounding said drain bonding pad.

10. A high frequency signal oscillator according to claim 9 made in a hybrid integrated circuit form.

11. A high frequency signal oscillator according to claim 9 made on a gallium arsenide substrate excluding said dielectric resonator.

12. A frequency converter comprising a high frequency signal oscillator according to claim 9, and a mixer for generating an intermediate frequency signal in response to a high-frequency signal from the input terminal thereof and a local oscillation signal from the output terminal of said high frequency signal oscillator.

13. A frequency converter according to claim 12 made in a hybrid integrated circuit form.

14. A frequency converter according to claim 12 made on a gallium arsenide substrate excluding said dielectric resonator.

15. A high frequency signal oscillator comprising:
a field effect transistor chip including a source, a source bonding pad connected to said source, a drain, a drain bonding pad connected to said drain, a gate, and two gate bonding pads each connected to the ends, respectively, of said gate;
a ceramic package enclosing said field effect transistor chip therein;
a source terminal connected to said source bonding pad and outgoing from said ceramic package;
a drain terminal connected to said drain bonding pad and outgoing from said ceramic package;
two gate terminals each connected to said two gate bonding pads, respectively, and outgoing from said ceramic package;
bias means for supplying bias voltages each to said source, drain and gate terminals, respectively;
a dielectric resonator connected through a coupling line to one of said gate terminals;
an output terminal of high frequency signal connected to the other of said gate terminals;
a capacitive reactance connected to said source terminal; and
grounding means for said high frequency signal for grounding said drain terminal.

16. A high frequency signal oscillator according to claim 15 made in hybrid integrated circuit form.

17. A high frequency signal oscillator comprising:
a field effect transistor chip including a source, a source bonding pad connected to said source, a drain, a drain bonding pad connected to said drain, a gate, and two gate bonding pads connected to one end of said gate, and a resistor interconnecting between said two gate bonding pads;
a ceramic package containing said field effect transistor chip therein;
a source terminal connected to said source bonding pad and outgoing from said ceramic package;
a drain terminal connected to said drain bonding pad and outgoing from said ceramic package;
two gate terminals each connected to said two gate bonding pads, respectively, and outgoing from said ceramic package;
bias means for supplying bias voltages each to said source, drain and gate terminals, respectively;
a dielectric resonator connected through a coupling line to one of said gate terminals;
an output terminal of high frequency signal connected to the other of said gate terminals;
a capacitive reactance connected to said source terminal; and
grounding means for said high frequency signal for grounding said drain terminal.

18. A high frequency signal oscillator according to claim 17 made in hybrid integrated circuit form.

19. A field effect transistor comprising a source, a source bonding pad connected to said source, a drain, a drain bonding pad connected to said drain, a gate, two gate bonding pads connected to said gate, said two gate bonding pads being arranged on opposite sides of said gate, a first circuit connected to an end of one of said gate bonding pads, and a second circuit connected to an end of the other of said gate bonding pads, said first circuit being different from said second circuit,
wherein said first circuit has a dielectric resonator and said second circuit has a load.

* * * * *